(12) United States Patent
Sudarsan

(10) Patent No.: US 6,432,792 B1
(45) Date of Patent: Aug. 13, 2002

(54) SUBSTRATE AND METHOD FOR MANUFACTURING THE SAME

(75) Inventor: Parthasarathy Sudarsan, Lorong Ah Soo (SG)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/708,279

(22) Filed: Nov. 8, 2000

Related U.S. Application Data

(62) Division of application No. PCT/EP99/03124, filed on May 6, 1999.

(51) Int. Cl.$^7$ .............................................. H01L 21/20
(52) U.S. Cl. .................................... 438/388; 438/311
(58) Field of Search ............................. 438/311, 355, 438/359, 360, 413, 424, 429, 431, 442, 524, 357, 358, 363, 388

(56) References Cited

U.S. PATENT DOCUMENTS

| | | | |
|---|---|---|---|
| 4,072,982 A | | 2/1978 | Stein |
| 4,897,362 A | * | 1/1990 | Delgado ............... 438/406 |
| 5,143,862 A | * | 9/1992 | Moslehi ............... 438/413 |
| 5,258,318 A | * | 11/1993 | Buti et al. ............ 438/207 |
| 5,294,559 A | | 3/1994 | Malhi |
| 5,455,194 A | | 10/1995 | Vasquez et al. |
| 5,599,722 A | * | 2/1997 | Sugisaka et al. ...... 438/406 |
| 5,793,093 A | | 8/1998 | Warwick |
| 6,013,933 A | * | 1/2000 | Foerstner et al. ...... 257/415 |

FOREIGN PATENT DOCUMENTS

| | | |
|---|---|---|
| DE | 1 439 712 | 11/1968 |
| WO | WO 94/22167 | 9/1994 |

OTHER PUBLICATIONS

Michael L. Alles: "Thin–film SOI emerges", IEEE Spectrum, Jun. 1997, pp. 37–45.

* cited by examiner

*Primary Examiner*—David Nelms
*Assistant Examiner*—David Nhu
(74) *Attorney, Agent, or Firm*—Laurence A. Greenberg; Werner H. Stemer; Gregory L. Mayback

(57) ABSTRACT

The present invention is directed to a method for manufacturing a substrate especially for SOI technologies. The new method includes the steps of: a) providing a semiconductor wafer having a front side where active devices ate to be located or are located and a back side opposite the front side; b) producing at least one trench in the back side of the wafer, the trench extending from the back side of the wafer to a level having a predetermined distance from the front side of the wafer; and c) producing an insulation structure in the trench so that vertical insulation for active devices located on the front side of the wafer is provided.

12 Claims, 2 Drawing Sheets

SUBSTRATE AND METHOD FOR MANUFACTURING THE SAME

CROSS-REFERENCE TO RELATED APPLICATION

This is a continuation of copending international application PCT/EP99/03124, filed May 6, 1999, which designated the United States.

BACKGROUND OF THE INVENTION

Field of the Invention:

The present invention is directed generally to the field of device insulation and more specifically to a substrate and a method for manufacturing a substrate especially for SOI technologies.

Description of the Related Art:

Semiconductor devices, especially silicon devices, have problems with inherent parasitic circuit elements due to junction capacitances. One way to circumvent the problem is to fabricate semiconductor devices on an insulating substrate. One of the initial approaches was to grow silicon epitaxially on a substrate of sapphire (called silicon-on-sapphire, or SOS). A more recent approach is the so called silicon-on-insulator (SOI) technology. The components or devices are thereby realized in a SOI substrate. A SOI substrate normally has an insulating layer of $SiO_2$ on a single-crystal silicon wafer and a single-crystal silicon layer on the insulating layer. This single-crystal silicon layer is the surface of the SOI substrate. The insulating layer of the SOI substrate assures the vertical insulation, whereas the lateral insulation of the components is realized for example by trenches filled with insulating material or local oxidation of silicon (LOCOS).

The advantages of the silicon-on-insulator technology are widely recognized: higher circuit speed, lower power consumption, greater immunity to radiation-induced errors, and compatibility with existing IC fabrication processes. However, the consistency and cost of the SOI substrates and their availability remains a problem. In order to form SOI substrates, any of a variety of methods may be used, see for example "Thin-film SOI merges" by M. L. Alles, IEEE Spectrum 35 Magazine, June 97, pages 37 to 45. In the prior art, the main manufacturing options are the so called "separation by implantation of oxygen" (Simox) and the so called "wafer bonding", each with a number of process variants.

The Simox process produces a SOI substrate by first implanting a silicon substrate with a relatively high dose of oxygen ions and then performing a high temperature anneal at about 1300° C. for several hours, in order to form a buried layer of silicon oxide. The wafer bonding process is a method of producing SOI substrates in which two silicon wafers each with oxide on the surface, are bonded together and annealed at temperatures higher than 800° C. to strengthen the bond. The bulk of one of the two wafers is then removed by any of several methods—grinding, etching, or polishing, for example.

Unfortunately, the conventional SOI technologies are quite expensive to realize. Therefore, SOI substrate prices typically are several times those of bulk silicon substrates, preventing SOI substrates from being used in cost-sensitive applications as low-end consumer electronics and DRAMs.

Accordingly, there is need for a new, simpler and more economical way of achieving circuit size reductions, speed improvements, and power reduction-operation at lower voltage.

SUMMARY OF THE INVENTION

It is accordingly an object of the invention to provide an a method for manufacturing a substrate for SOI technologies and a substrate produced by the method which overcomes the above-mentioned disadvantageous of the prior art apparatus and methods of this general type.

With the foregoing and other objects in view there is provided, in accordance with the invention a method of producing a substrate that includes steps of:

a) providing a semiconductor wafer, having a front side where active devices are to be located or are located and a back side opposite to the front side;

b) producing at least a trench in the back side of the wafer, the trench extending from the back side of the wafer to a level having a predetermined distance from the front side of the wafer; and c) producing an insulation structure in the trench, so that a vertical insulation for active devices located on the front side of the wafer is provided.

In accordance with an added feature of the invention, step c) of producing an insulation structure in the trench includes filling the trench with insulating material, or providing the surfaces inside the trench with a layer made of insulating material. Preferably, the insulating material is selected from the group consisting of $SiO_2$ and $Si_3N_4$.

In case the sidewalls of the trench are provided with a layer made of insulating material, it is preferred that the remaining part of the trench is filled with a fill suitable of providing mechanical stability, preferably a silicon fill or a metal fill.

In case the remaining part of the trench is to be filled with a silicon fill, it is preferred that the filling is done by the deposition and re-etching of a silicon layer.

In accordance with an additional feature of the invention, the trench is produced by etching the wafer using a trench mask. The trench mask preferably has a layer sequence with a lower layer of thermal $SiO_2$, a middle layer of CVD $Si_3N_4$ and an upper layer of CVD $SiO_2$.

For reasons of mechanical stability it is also preferred that the step b) of producing at least one trench and the step c) of producing an insulating structure are repeated until a predetermined percentage of the back side of the wafer is made of the insulating structure.

Other features which are considered as characteristic for the invention are set forth in the appended claims.

Although the invention is illustrated and described herein as embodied in a substrate and method for manufacturing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
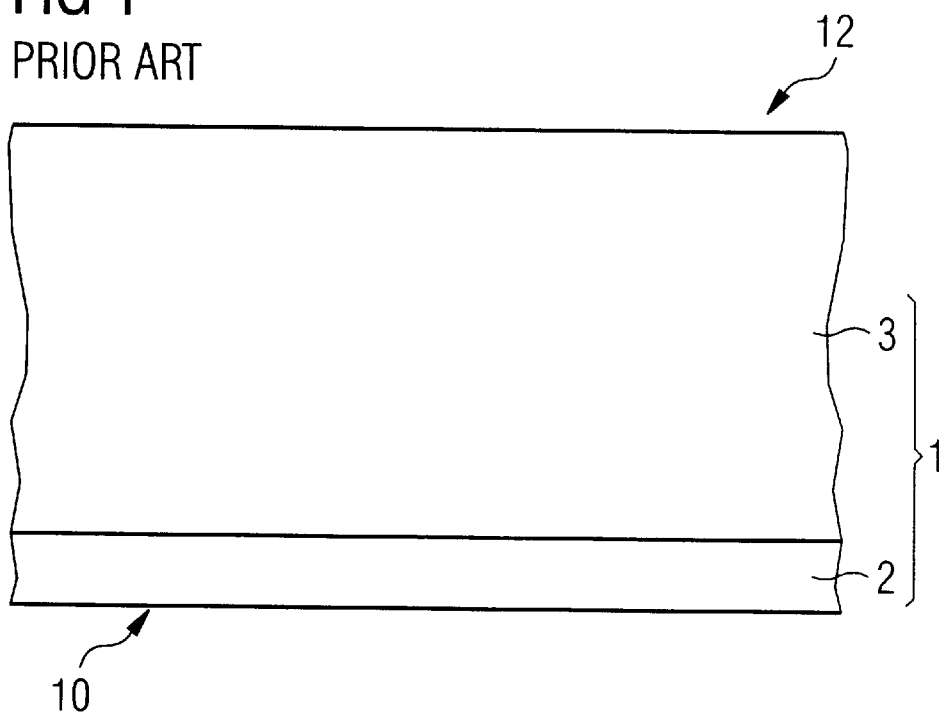
FIG. 1 illustrates a conventional silicon substrate.

Referring now to the figures of the drawing in detail and first, particularly, to FIG. 1 thereof, there is shown a silicon wafer 1 that has a monocrystalline bulk 3 and a monocrystalline epitaxial layer 2. The monocrystalline silicon bulk 3, for example is p+-doped with a dopant concentration of, for example, $5.0 \times 10^{19}$ boron/cm$^3$. The monocrystalline epitaxial layer 2, for example, is lightly n-doped with a dopant concentration of, for example, $4.0 \times 10^{14}$ phosphorous/cm$^3$ and has a thickness of, for example, 20 μm. The surface of the epitaxial layer 2 forms the front side 10 of the wafer where active devices are to be located, whereas the surface of the monocrystalline silicon bulk 3 forms the back side 12 of the wafer.

Figure 2:
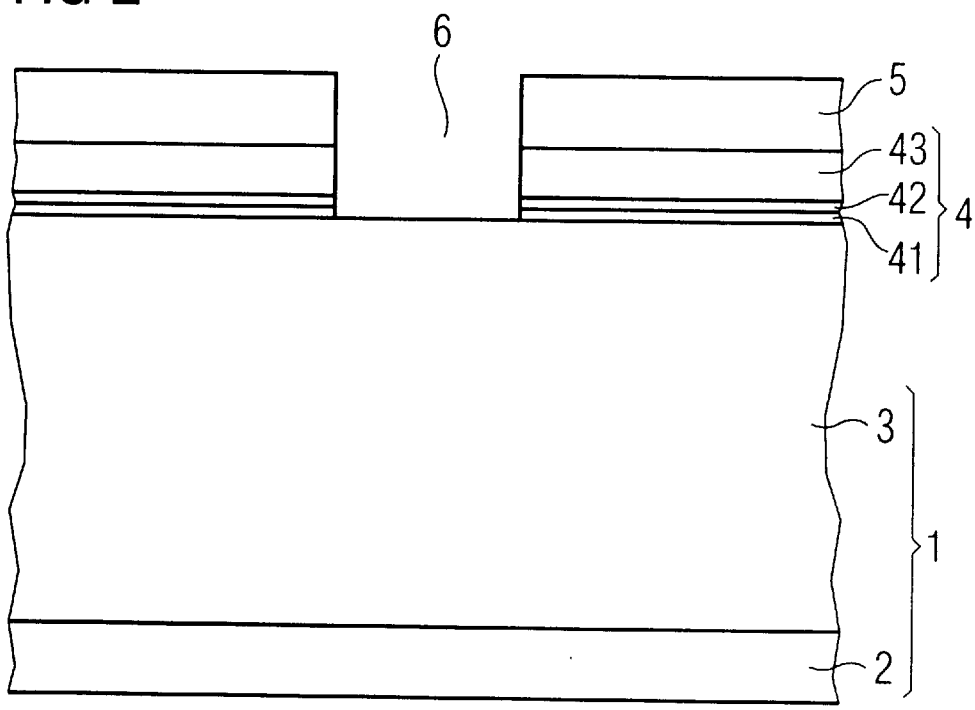
FIG. 2 illustrates the silicon substrate after deposition of a trench mask.

A trench mask 4 is formed on the surface of the monocrystalline silicon bulk 3. To that end, the surface of the monocrystalline silicon bulk 3 is first thermally oxidized. A lower layer 41 of thermal SiO$_2$ having a thickness of, for example 50 nm results. A middle layer 42 of a CVD Si$_3$N$_4$ having a thickness of, for example, 150 nm is produced thereon. An upper layer 43 of a CVD SiO$_2$ is deposited on the middle layer 42 with a thickness of, for example, 1000–1600 nm, The layer sequence consisting of the lower layer 41, the middle layer 42 and the upper layer 43 is structured using a photoresist mask 5, for example in a CHF$_3$/O$_2$ dry-etching process (see FIG. 2).

Figure 3:
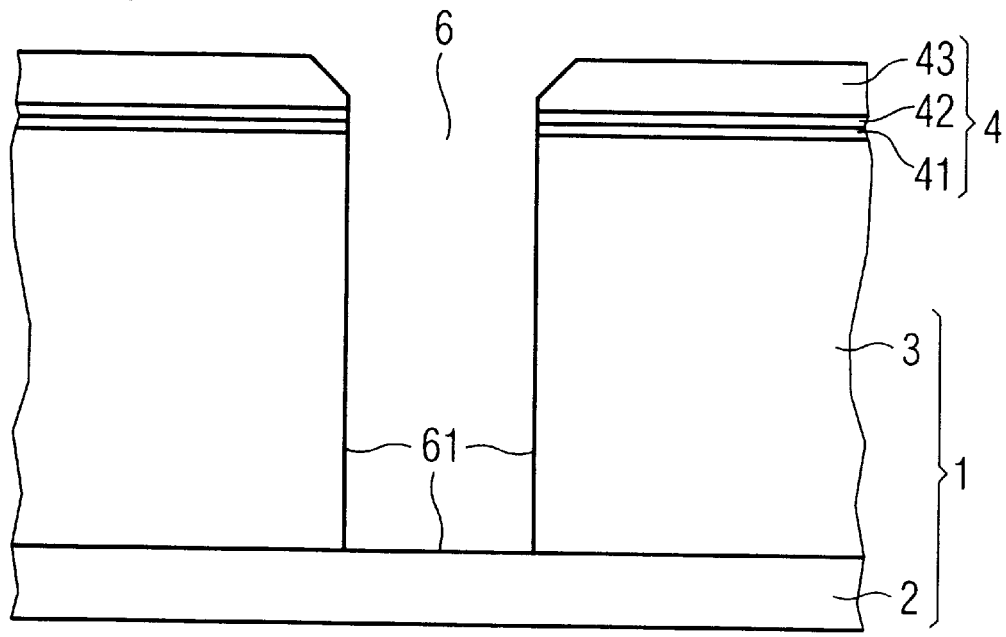
FIG. 3 illustrates the silicon substrate after the trench etching.

After the removal of the photoresist mask 5, a trench 6 is etched into the monocrystalline silicon bulk 3 (see FIG. 3). For example, the etching of the trench 6 occurs in an anisotropic dry-etching process with a Cl$_2$/O$_2$ chemistry. The etching of the trench is done in such a manner that the trench extends from the back side 12 of the wafer to a level having a predetermined distance from the front side 10 of the wafer. In the present example, the trench extends to monocrystalline epitaxial layer 2. After the removal of etching products in a HF dip, the trench 6 is present with clean sidewalls 61 on the silicon bulk 3. Furthermore, the trench mask 4 is removed. Thereafter, an insulation layer 7 Of SiO$_2$ is applied onto the surfaces of the trench 6 in a CVD process, for example with a TEOS method. The remaining part of the trench is then filled by depositing and re-etching a silicon layer 8 (see FIG. 4). Thereby, an insulation structure 9 is produced in the trench 6, so that a vertical insulation for active devices is provided. The active devices are to be located in the monocrystalline epitaxial layer 2 on the front side 10 of the wafer 1.

Figure 4:
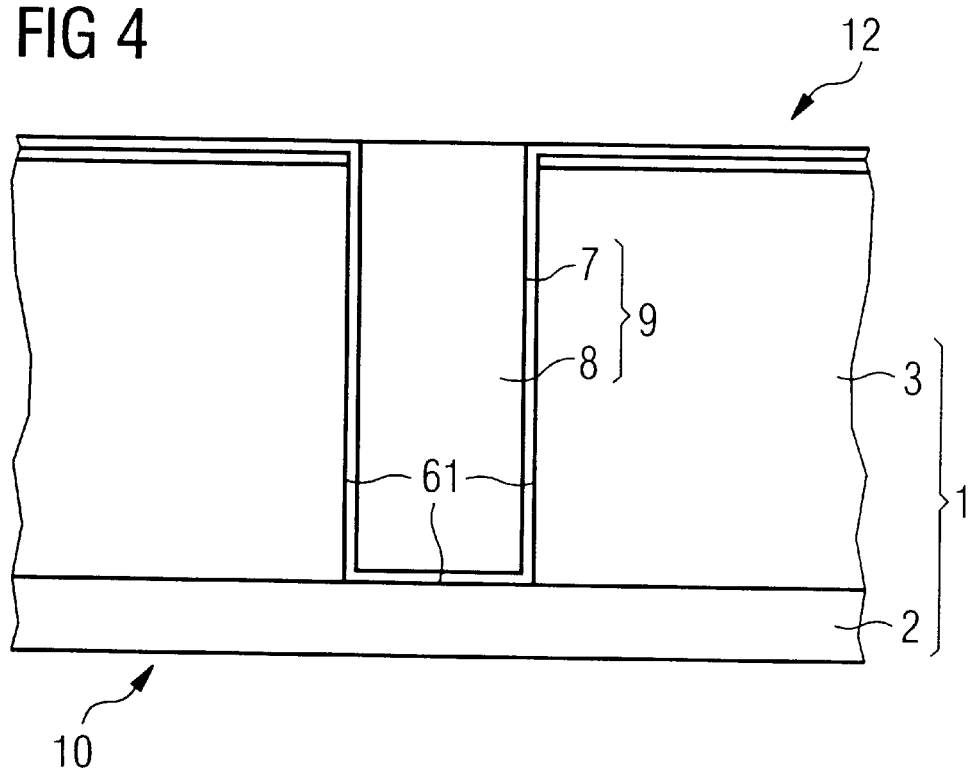
FIG. 4 illustrates the silicon substrate after deposition of an insulation layer and filling the remaining part of the trench with a silicon fill.

The resulting SOI substrate may now be further processed, in order to form integrated circuits thereon. Thereby, the SOI substrate shown in FIG. 4 is turned around, so that the monocrystalline epitaxial layer 2 is located on top of the remaining silicon bulk 3 and the insulation structure 9.

Only conventional methods for trench etching and trench filling from CMOS fabrication are used in the method of the invention. Since the CMOS fabrication is already necessary for producing the logic components, a synergy effect is thereby exploited.

It should be understood that various changes and modifications to the presently preferred embodiments described herein will now be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A method for manufacturing a substrate for silicon-on-insulator technologies, which comprises:
    a) providing a semiconductor wafer having a front side for receiving active devices and a back side opposite the front side;
    b) producing a monocrystalline epitaxial layer on the front side of the semiconductor wafer such that the epitaxial layer has a doping type that is opposite that of the semiconductor wafer;
    c) producing a mask on the back of the wafer;
    d) using the mask to produce at least one trench in the back side of the wafer such that the trench extends from the back side of the wafer to an interface between the semiconductor wafer and the epitaxial layer; and
    e) producing an insulation structure in the trench so that a vertical insulation is provided for active devices received on the epitaxial layer on the wafer.

2. The method according to claim 1, wherein the step of producing an insulation structure in the trench includes filling the trench with insulating material.

3. The method according claim 2, wherein the insulating material is a material selected from the group consisting of SiO$_2$ and Si$_3$N$_4$.

4. The method according to claim 1, wherein the step of producing an insulation structure in the trench includes providing surfaces inside the trench with a layer made of insulating material.

5. The method according claim 4, wherein the insulating material is a material selected from the group consisting of SiO$_2$ and Si$_3$N$_4$.

6. The method according to claim 4, which comprises filling a remaining portion of the trench with a fill suitable of providing mechanical stability.

7. The method according to claim 6, wherein the fill suitable of providing mechanical stability is selected from the group consisting of a silicon fill and a metal fill.

8. The method according to claim 6, wherein fill suitable of providing mechanical stability is a silicon fill; and the step of filling the remaining portion of the trench includes depositing and re-etching a silicon layer.

9. The method according to claim 1, wherein the step of using the mask to produce at least one trench includes using the mask to etch the trench.

10. The method according to claim 9, wherein the trench mask includes a layer sequence with a lower layer of thermal SiO$_2$, a middle layer of CVD Si$_3$N$_4$ and an upper layer Of CVD SiO$_2$.

11. The method according to claim 1 wherein the step of producing at least one trench and the step of producing an insulating structure are repeated until the back side of the wafer is made of the insulating structure.

12. A substrate for silicon-on-insulator technologies comprising the semiconductor wafer that is produced by the method according to claim 1.

* * * * *

UNITED STATES PATENT AND TRADEMARK OFFICE
CERTIFICATE OF CORRECTION

PATENT NO. : 6,432,792 B1
DATED : August 13, 2002
INVENTOR(S) : Parthasarathy Sudarsan It is certified that error appears in the above-identified patent and that said Letters Patent is hereby corrected as shown below:

<u>Title page,</u>
Item [30], should read as follows:
-- [30] Foreign Application Priority Data
May. 8, 2002 (EP) ........................ 98108448.6 --

Signed and Sealed this

Seventh Day of January, 2003

JAMES E. ROGAN
*Director of the United States Patent and Trademark Office*